US009257555B1

(12) United States Patent
Lin et al.

(10) Patent No.: US 9,257,555 B1
(45) Date of Patent: Feb. 9, 2016

(54) SEMICONDUCTOR STRUCTURE

(71) Applicant: MACRONIX INTERNATIONAL CO., LTD., Hsinchu (TW)

(72) Inventors: Cheng-Chi Lin, Yilan County (TW); Yu-Neng Yeh, Changhua County (TW); Shih-Chin Lien, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/469,620

(22) Filed: Aug. 27, 2014

(51) Int. Cl.
*H01L 21/02* (2006.01)
*H01L 29/78* (2006.01)
*H01L 29/06* (2006.01)

(52) U.S. Cl.
CPC ........ *H01L 29/7835* (2013.01); *H01L 29/0642* (2013.01)

(58) Field of Classification Search
CPC ............ H01L 29/0642; H01L 29/7832; H01L 29/7835; H01L 29/7838
USPC .................. 257/344, 408, E29.027, E21.177
See application file for complete search history.

(56) References Cited

U.S. PATENT DOCUMENTS

2015/0001636 A1* 1/2015 Cheng et al. ................. 257/379

* cited by examiner

*Primary Examiner* — Jasmine Clark
(74) *Attorney, Agent, or Firm* — McClure, Qualey & Rodack, LLP

(57) ABSTRACT

A semiconductor structure is provided. The semiconductor structure comprises a doped substrate, a gate structure, a source, a drain and a field doped region. The source and the drain are in the doped substrate on opposing sides of the gate structure respectively. The field doped region has a conductivity type opposite to a conductivity type of the source and the drain. The field doped region is extended from the source to be beyond a first gate sidewall of the gate structure but not reach a second gate sidewall of the gate structure opposing to the first gate sidewall.

19 Claims, 17 Drawing Sheets

S
134
106 116 112 114 108
132 136 138 126 120 110 104 122 128 124
102 140 142 130 118 L3 L1

134
132 136 138 124 128 124
140 142 102

SEMICONDUCTOR STRUCTURE

BACKGROUND

1. Technical Field

The disclosure relates in general to a semiconductor structure, and particularly to a MOS structure.

2. Description of the Related Art

In the semiconductor technology, the feature size of the semiconductor structure has been reduced. In the meantime, the rate, the efficiency, the density and the cost per integrated circuit unit have been improved.

For example, many methods have been proposed for increasing a breakdown voltage (BVD) of a semiconductor structure such as a MOS and so on. However, an on-state resistance (Ron) of the semiconductor structure would be increased due to the conventional methods. Therefore, the semiconductor structure could not obtain a trade off between the BVD and the Ron for obtaining a desired small figure of merit (FOM=Ron/BVD).

SUMMARY

According to an embodiment of the present disclosure, a semiconductor structure is provided. The semiconductor structure comprises a doped substrate, a gate structure, a source, a drain and a field doped region. The source and the drain are in the doped substrate on opposing sides of the gate structure respectively. The field doped region has a conductivity type opposite to a conductivity type of the source and the drain. The field doped region is extended from the source to be beyond a first gate sidewall of the gate structure but not reach a second gate sidewall of the gate structure opposing to the first gate sidewall.

According to another embodiment of the present disclosure, a semiconductor structure is provided. The semiconductor structure comprises a doped substrate, a gate structure, a source, a drain and a field doped region. The source and the drain are in the doped substrate on opposing sides of the gate structure respectively. The field doped region has a conductivity type opposite to a conductivity type of the source and the drain. The field doped region is adjoined under the gate structure and has a field sidewall between opposing first and second gate sidewalls of the gate structure.

According to yet another embodiment of the present disclosure, a semiconductor structure is provided. The semiconductor structure comprises a doped substrate, a gate structure, a source, a drain and a field doped region. The gate structure has a gate length. The source and the drain are in the doped substrate on opposing sides of a first gate sidewall and a second gate sidewall of the gate structure respectively. The field doped region is separated from the drain by the doped substrate. The field doped region has a field sidewall facing toward the drawn. The second gate sidewall and the field sidewall have a gap length therebetween. A ratio of the gap length to the gate length is 0.1 μm~1 μm.

The above and other embodiments of the disclosure will become better understood with regard to the following detailed description of the non-limiting embodiment(s). The following description is made with reference to the accompanying drawings.

DETAILED DESCRIPTION

Figure 1A:
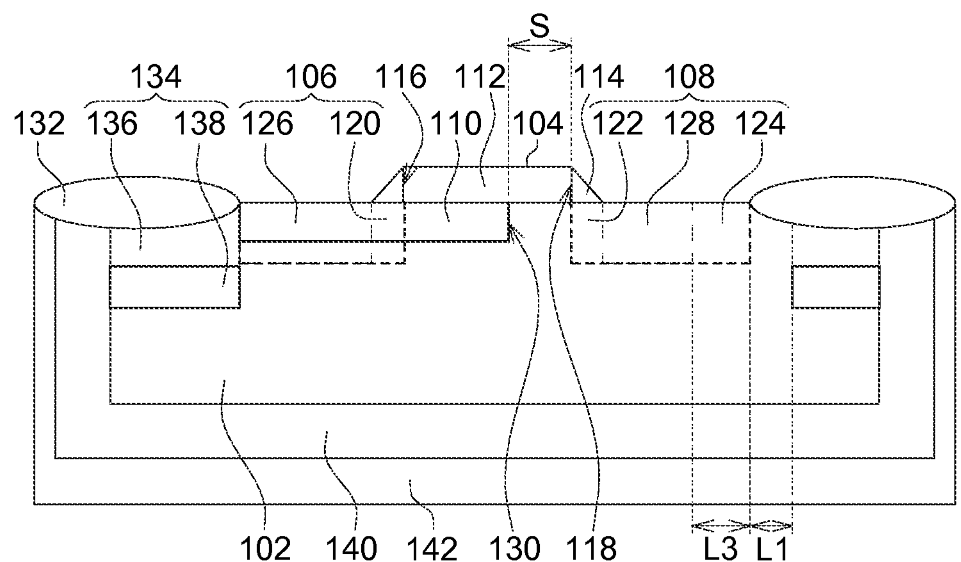
FIG. 1A is a cross-section view of a semiconductor structure according to one embodiment.
Figure 1B:
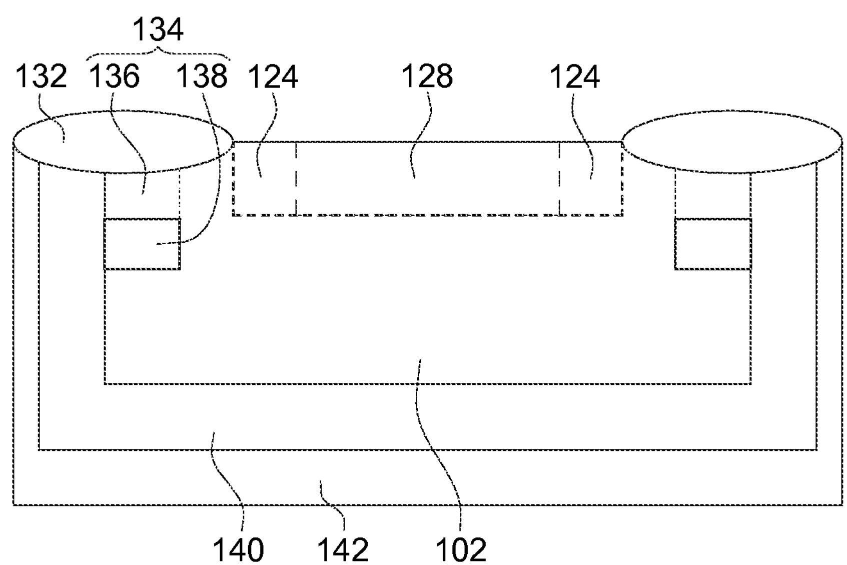
FIG. 1B is a cross-section view of a semiconductor structure according to one embodiment.
Figure 2:
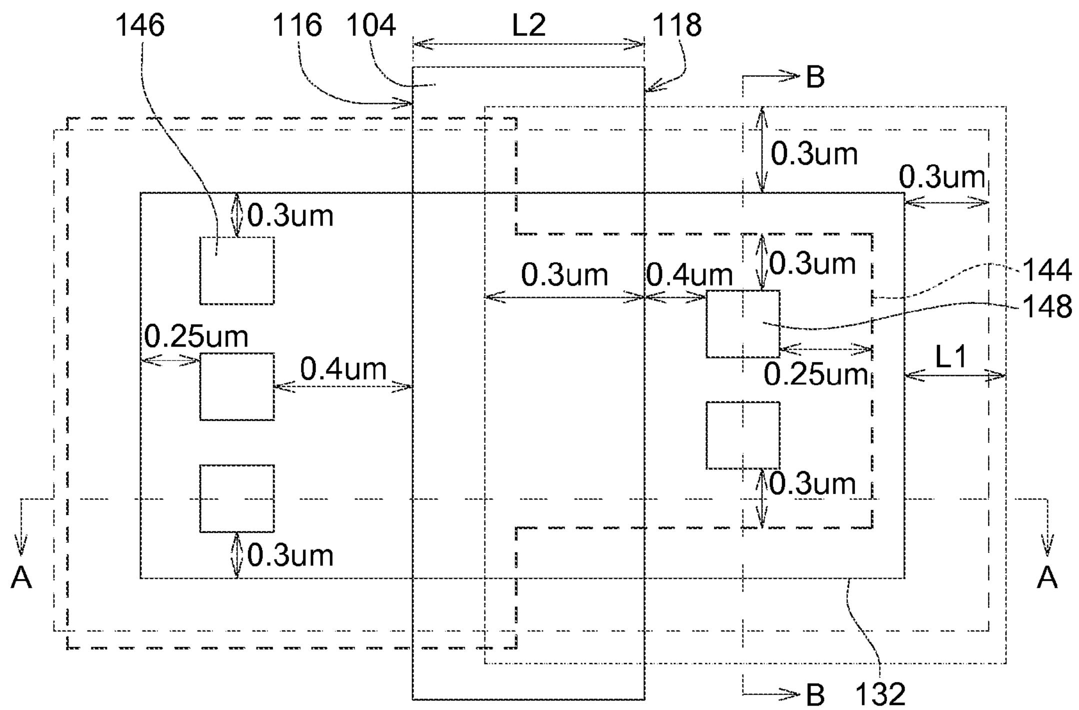
FIG. 2 shows a layout design for a semiconductor structure according to one embodiment.

Referring to FIG. 1A and FIG. 1B, respectively illustrating cross-section views of a semiconductor structure along a AA line and a BB line shown in FIG. 2 of a layout design for the semiconductor structure according to one embodiment, the semiconductor structure comprises a doped substrate 102, a gate structure 104, a source 106, a drain 108 and a field doped region 110. In one embodiment, the semiconductor structure is a NMOS structure, wherein the doped substrate 102 and the field doped region 110 have a first type conductivity such as P type conductivity, and the source 106 and the drain 108 have a second type conductivity such as N type conductivity, opposite to the first type conductivity.

Referring to FIG. 1A, the gate structure 104 disposed on the doped substrate 102 may comprise a gate dielectric layer and a gate electrode layer 112 on the gate dielectric layer. The gate dielectric layer may comprise an oxide or a nitride, such as silicon oxide, silicon nitride or silicon oxynitride, or other suitable dielectric materials. The gate electrode layer 112 may comprise single crystal silicon, polysilicon, a metal, a metal silicide, or other suitable conductive materials. A spacer 114 may be disposed on a first gate sidewall 116 and a second gate sidewall 118 of the gate electrode layer 112. The spacer 114 may comprise an oxide or a nitride, such as silicon oxide, silicon nitride or silicon oxynitride, or other suitable dielectric materials.

The source 106 and the drain 108 are in the doped substrate 102 on opposing sides of the gate structure 104, respectively. In embodiments, the source 106 and the drain 108 has a non-symmetrical arrange with the gate structure 104 as an axis. For example, the source 106 and the drain 108 comprise adjacent first doped portions 120, 122, 124 and second doped portions 126, 128, all having the N type conductivity. Dopant concentrations of the first doped portions 120, 122, 124 (N−) are lower than dopant concentrations of the second doped portions 126, 128 (N+). The first doped portions 122, 124 of the drain 108 are extended beyond the opposing sidewalls of the second doped portion 128 respectively. As shown in FIG. 1A, the first doped portion 122 extended beyond the sidewall of the second doped portion 128 closer to the gate structure 104 is under the spacer 114. The first doped portion 124 is extended beyond the sidewall of the second doped portion 128 far away from the gate structure 104. In one embodiment, the first doped portion 120 of the source 106 is extended beyond only the sidewall of the second doped portion 126 closer to the gate structure 104 among the opposing sidewalls of the second doped portion 126, and is under the spacer 114. In an another embodiment, the first doped portion of the source 106 (comprising the first doped portion 120) is extended beyond the opposing sidewalls of the second doped portion 126, wherein an length of the first doped portion (not shown) of the source 106 extended beyond the sidewall of the second doped portion 126 farther from the gate structure 104 is smaller than a length of the first doped portion 124 of the drain 108 extended beyond the sidewall of the second doped portion 128 farther from the gate structure 104.

The field doped region 110 and the doped substrate 102 both have the P type conductivity, and the P dopant concentration of the field doped region 110 is higher than the P dopant concentration of the doped substrate 102. The field doped region 110 is between the first doped portion 120 of the source 106 and the first doped portion 122 of the drain 108. The field doped region 110 may be adjoined under the gate dielectric layer of the gate structure 104. The field doped region 110 is in the doped substrate 102 adjacent to the first gate sidewall 116 of the gate structure 104, but not in the doped substrate 102 adjacent to the second gate sidewall 118 of the gate structure 104. For example, the field doped region 110 is extended from the source 106 to be beyond the first gate sidewall 116 of the gate structure 104, but is not extended to reach the second gate sidewall 118 of the gate structure 104. The field doped region 110 has a field sidewall 130 in the doped substrate 102 between the first gate sidewall 116 and the second gate sidewall 118 of the gate structure 104. The doped substrate 102 between the field doped region 110 and the drain 108 has a substrate length L1. A distance between the first gate sidewall 116 and the second gate sidewall 118 of the gate structure 104 is defined as a gate length L2. The second gate sidewall 118 and the field sidewall 130 adjacent to the drain 108 have a gap length S therebetween. In one embodiment, the substrate length L1 and the gap length S respectively are 0.1 μm~1 μm, such as 0.3 μm. A ratio (S/L2) of the gap length S to the gate length L2 may be 0.1~0.5.

The semiconductor structure may comprise an isolation structure 132 for defining an active region. The first doped portion 124 of the drain 108 is in the doped substrate 102 between the isolation structure 132 and the second doped portion 128. The first doped portion 124 may have a length L3 of 0.1 μm~1 μm, such as 0.3 μm. The isolation structure 132 is not limited to the FOX structure, and may use the STI structure, or other suitable insulating materials, such as a nitride, etc.

The semiconductor structure may comprise a doped field 134. The doped field 134 may comprise a shallower field region 136 and a deeper field region 138, all having the P type conductivity, in the substrate 102 under the isolation structure 132. The first doped portion 124 of the drain 108 and the doped field 134 are separated from each other by the doped substrate 102. The doped substrate 102 separating the first doped portion 124 and the doped field 134 has the substrate length L1. A gap distance (i.e. the substrate length L1) between the first doped portion 124 and the doped field 134 is bigger than a gap distance between the source 106 and the doped field 134. In some examples, a gap distance of the edge of the isolation structure 132 most close to the gate structure 104 and the doped field 134 is substantially equal to the substrate length L1.

A well region 140 of the N type conductivity may be on a lower surface of a sidewall of the doped substrate 102. A semiconductor substrate 142 of the P type conductivity may be on a lower surface and a sidewall of the well region 140.

FIG. 2 illustrates a layout design for the semiconductor structure in one embodiment. A doping layout 144 for the second doped portions 126, 128 has an asymmetric design according to the gate structure 104 as an axis. Contact structures 146 corresponding to the region of the source have a gap distance of 0.3 μm to upper or lower sides of the isolation structure 132, a gap distance of 0.25 μm to a left side of the isolation structure 132, and a gap distance of 0.4 μm to the first gate sidewall 116 of the gate structure 104. Contact structures 148 corresponding to the region of the drain have a gap distance of 0.4 μm to the second gate sidewall 118 of the gate structure 104, a gap distance of 0.3 μm to upper and lower edges of the doping layout 144 for forming the second doped portion, and a gap distance of 0.25 μm of a right edge of the doping layout 144. A gap distance of the edge of the doping layout 144 and the inner edge of the isolation structure 132 is 0.3 μm. However, the present disclosure is not limited to the above sizes and designs, and may be varied properly according to actual demands.

Figure 3A:
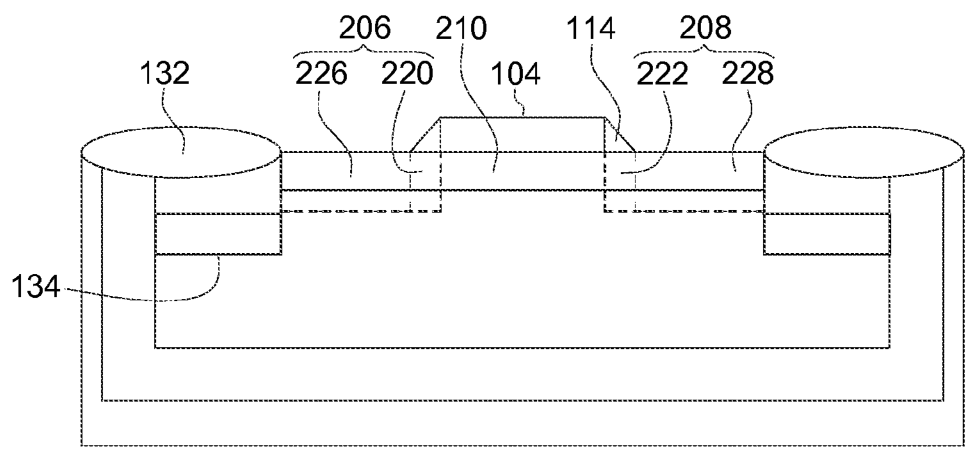
FIG. 3A is a cross-section view of a semiconductor structure of a comparative example.
Figure 3B:
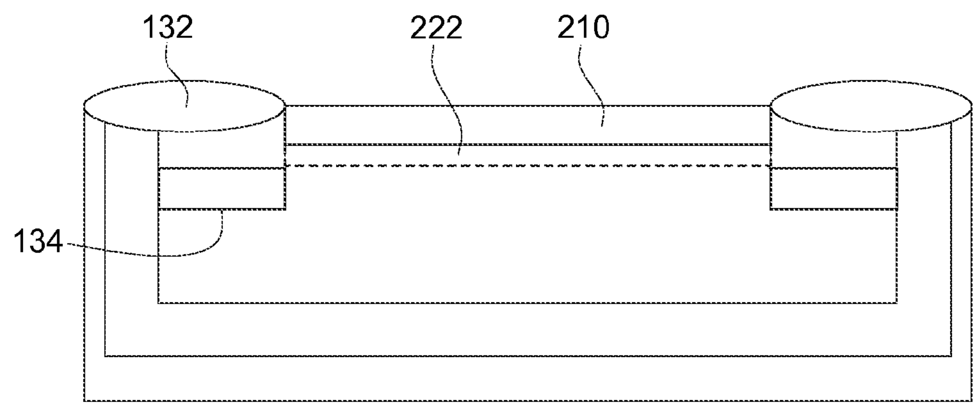
FIG. 3B is a cross-section view of a semiconductor structure of a comparative example.
Figure 3C:
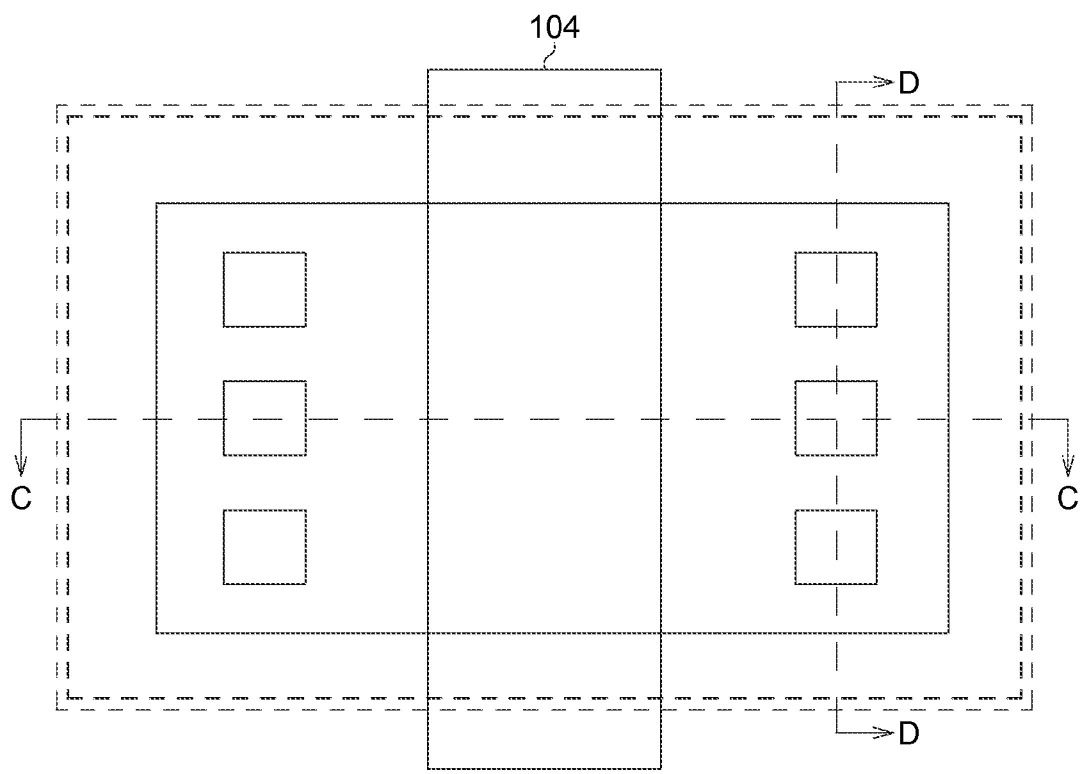
FIG. 3C shows a layout design for a semiconductor structure of a comparative example.

FIG. 3A and FIG. 3B illustrate cross-section views of a semiconductor structure of a comparative example along a CC line and a DD line shown in FIG. 3C of a layout design for the semiconductor structure according. The comparative example of FIG. 3A and FIG. 3B is different from the embodiment shown in FIG. 1A and FIG. 1B in the following illustrating. The first doped portion 220 of the source 206 is extended beyond only one of the opposing sidewalls of the second doped portion 226 closer to the gate structure 104 to be under the spacer 114, and the first doped portion 222 of the drain 208 is extended beyond one of the opposing sidewalls of the second doped portion 228 closer to the gate structure 104 to be under the spacer 114. The first doped portion 124 shown in FIG. 1A is omitted for the drain 208. The field doped region 210 is continuously extended between the source 206 and the drain 208. A gap distance between the isolation structure 132 and the second doped portion 226 of the source 206 is substantially equal to a gap distance between isolation structure 132 and the second doped portion 228 of the drain 208. A gap distance between the doped field 134 and the source 206 is substantially equal to a gap distance between the doped field 134 and the drain 208. The comparative example of FIG. 3C is different from the embodiment shown in FIG. 2 in that the doping layouts for the second doped portions 226, 228 and the field doped region 210 have symmetric designs with the gate structure 104 as an axis.

Figure 4:
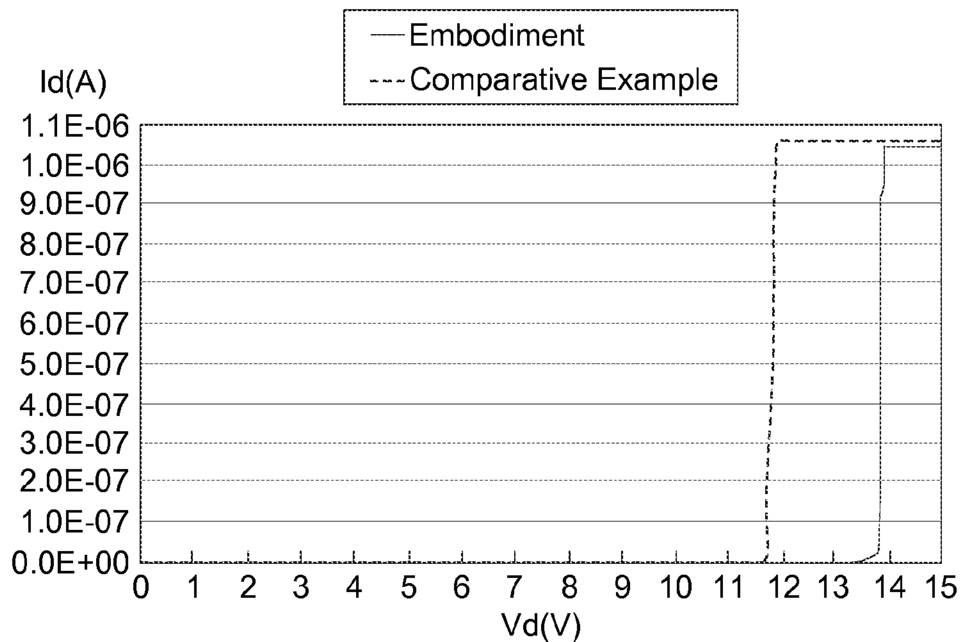
FIG. 4 shows electrical characteristic curves of semiconductor structures of example and comparative example.
Figure 5:
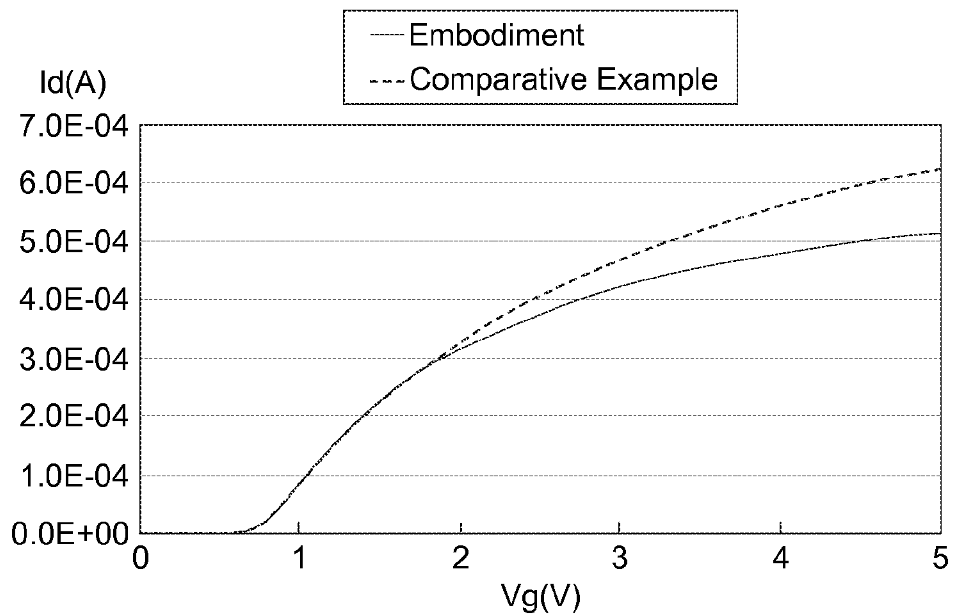
FIG. 5 shows electrical characteristic curves of semiconductor structures of example and comparative example.
Figure 6:
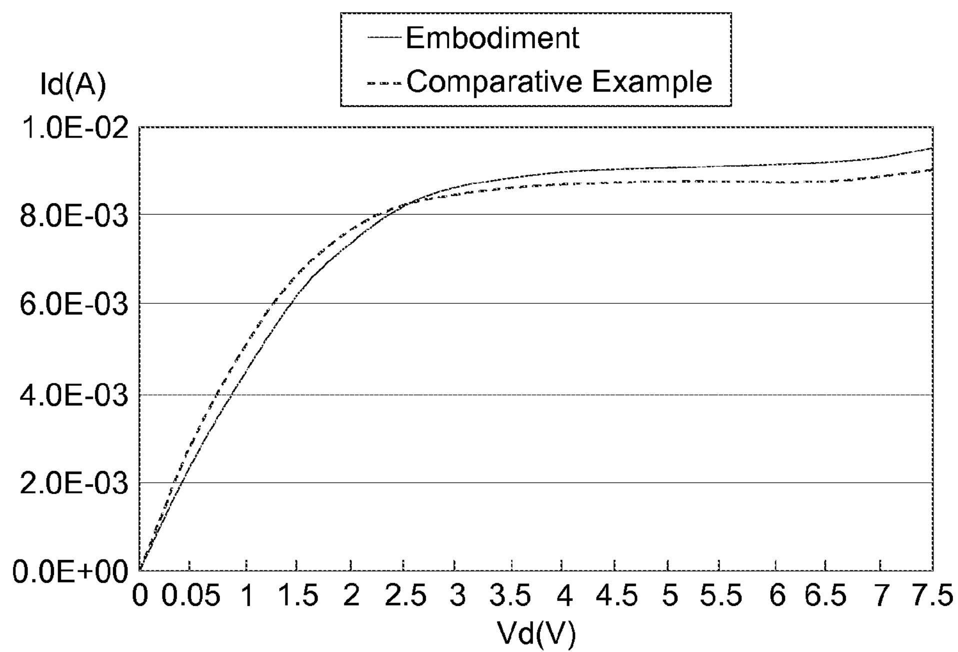
FIG. 6 shows electrical characteristic curves of semiconductor structures of example and comparative example.

FIG. 4 to FIG. 6 are electrical characteristic curves of the semiconductor structures of embodiment and comparative example. FIG. 4 shows that a drain breakdown voltage of the semiconductor structure of embodiment (off state) is 13.9V, and a drain breakdown voltage of the semiconductor structure of comparative example is 11.9V. In other words, the breakdown voltage of embodiment is higher than the breakdown voltage of comparative example with 2V. A threshold voltage (FIG. 5) and a drain current (on state) (FIG. 6) of the semiconductor structure of embodiment is comparable to those of the semiconductor structure of comparative example. Therefore, the designs in the embodiment can increase the breakdown voltage for the semiconductor structure, and maintain other electrical characteristics at the same time.

FIG. 7A to FIG. 15B illustrate a manufacturing flow for the semiconductor structure according to one embodiment, wherein the figure marked with A are cross-section views along a location of the AA line shown in FIG. 2, and the figure marked with B are cross-section views along a location of the BB line shown in FIG. 2.

Figure 7A:
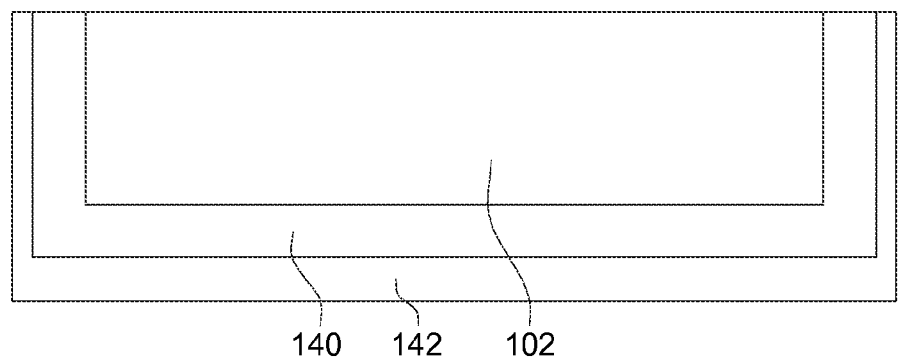
FIG. 7A to FIG. 15B illustrate a manufacturing flow for a semiconductor structure according to one embodiment.
Figure 7B:
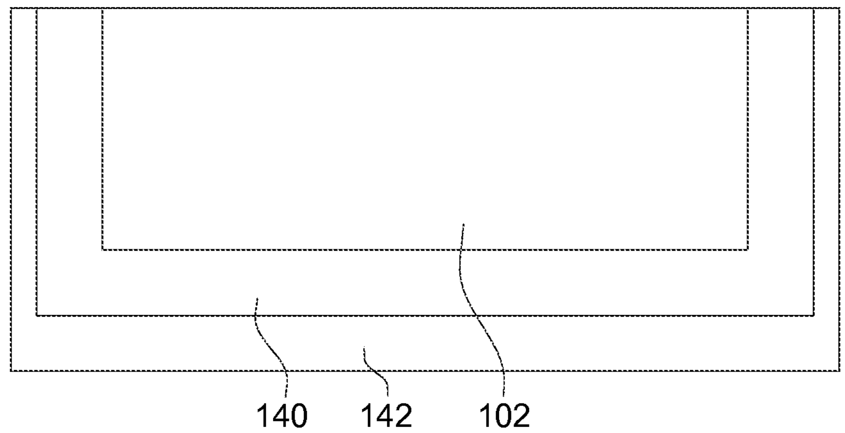

Referring to FIG. 7A and FIG. 7B, the semiconductor substrate 142 of the P type conductivity is provided. The semiconductor substrate 142 may comprise a silicon substrate, a SOI structure, an epitaxial material, or other suitable semiconductor materials. The well region 140 of the N type conductivity may be formed by doping an N type dopant into the semiconductor substrate 142. The doped substrate 102 of a well structure may be formed by doping a P type dopant into the well region 140.

Figure 8A:
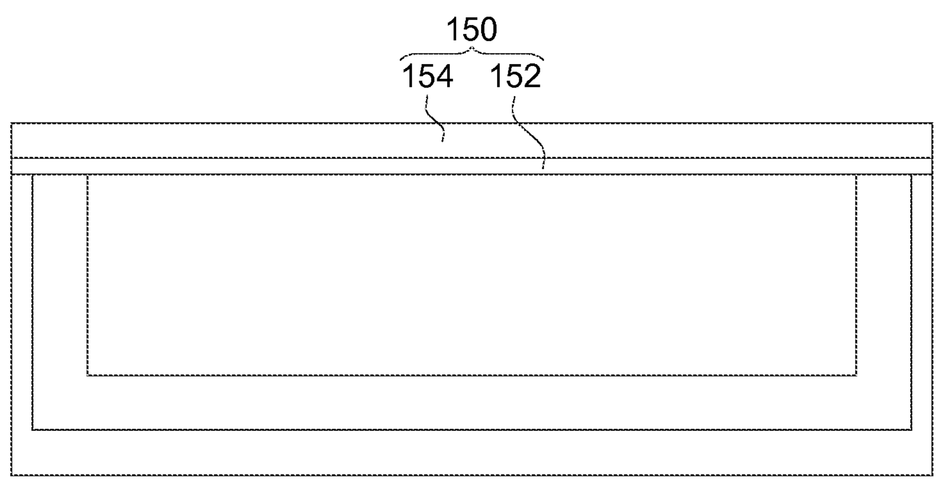
Figure 8B:
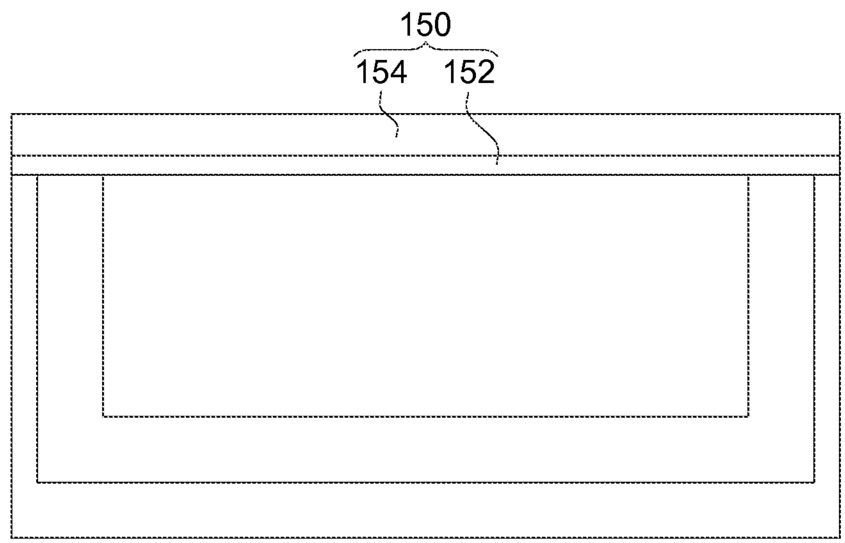

Referring to FIG. 8A and FIG. 8B, a mask layer 150 is formed on the structure shown in FIG. 7A and FIG. 7B. The mask layer 150 may comprise an oxide layer 152 and a nitride layer 154 formed by a deposition method such as a CVD method or PVD method, or other suitable methods. The mask layer 150 may use other suitable materials or structures, such a single-layer material film, etc.

Figure 9A:
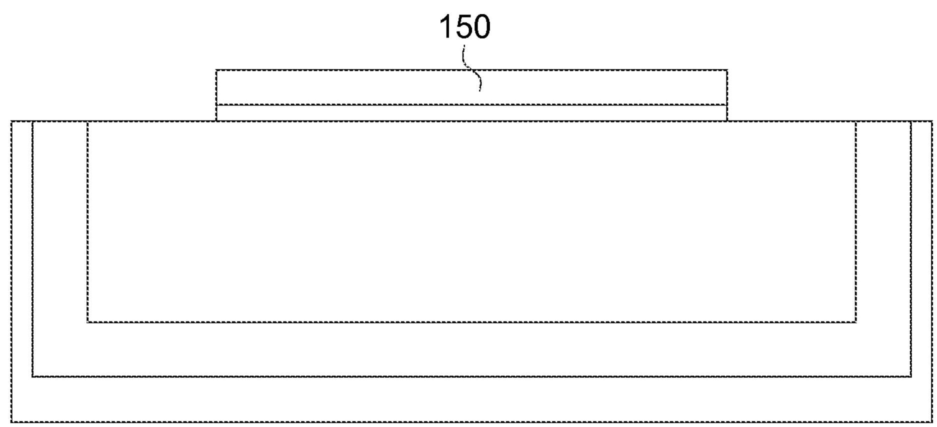
Figure 9B:
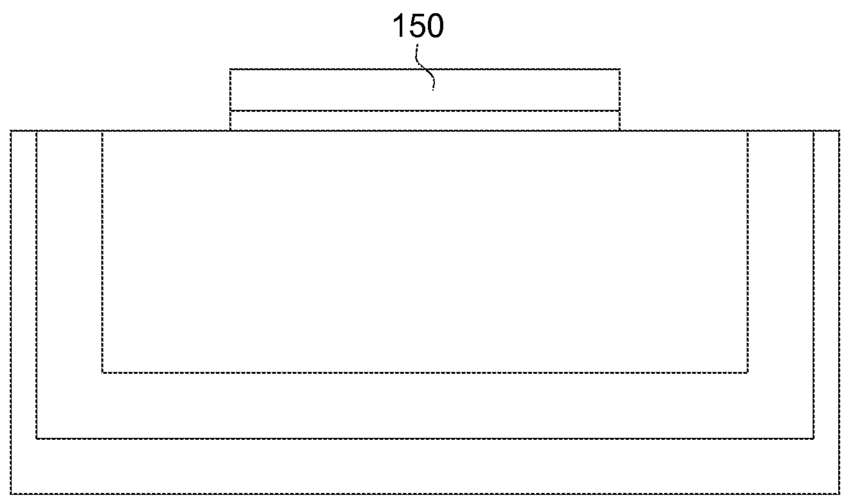

Referring to FIG. 9A and FIG. 9B, the mask layer 150 may be patterned by using a lithography process.

Figure 10A:
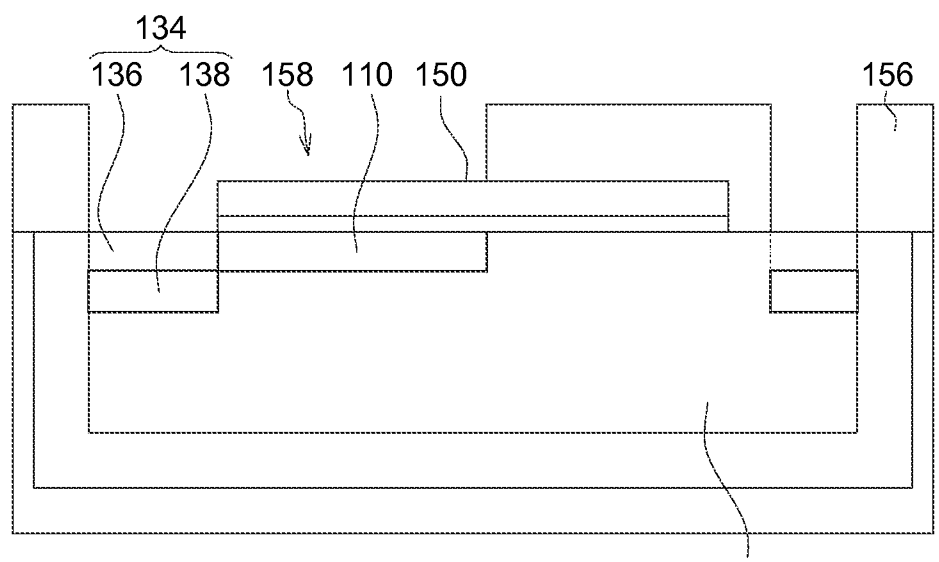
Figure 10B:
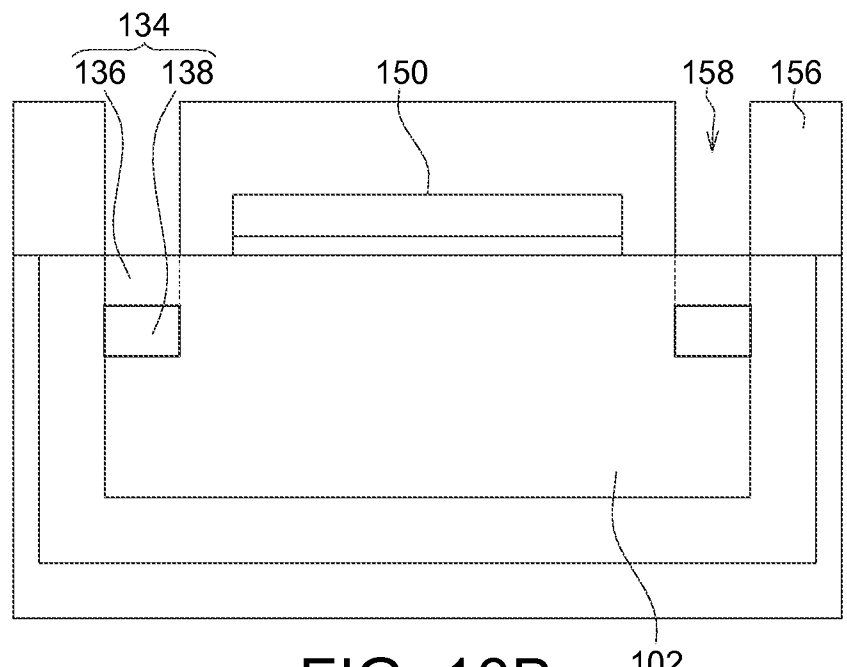

Referring to FIG. 10A and FIG. 10B, a patterned photoresist layer 156 is formed, having an opening 158 exposing a portion of the doped substrate 102 and a portion of the mask layer 150. For example, an implantation process of a higher doping energy for a P type dopant is performed to form the field doped region 110 under the mask layer 150 exposed by the opening 158, and form the deeper field region 138 in a portion of the doped substrate 102 not covered by the mask layer 15 and deeper than the field doped region 110. An another implantation process of a lower doping energy for a P type dopant is performed to form the shallower field region 136 in the portion of the doped substrate 102 not covered by the mask layer 150 and on the deeper field region 138. The field doped region 110 and the doped field 134 may be not limited to the illustrated methods, and may be formed by using other kinds of photoresist pattern designs, doping sequences, steps and times, or other methods. In other embodiments, for example, the field doped region 110 and the doped field 134 may be formed at the same time by a single implantation process. The field doped region 110 and the doped field 134 may be formed by different steps, or by a tilt angle implantation process, etc.

Figure 11A:
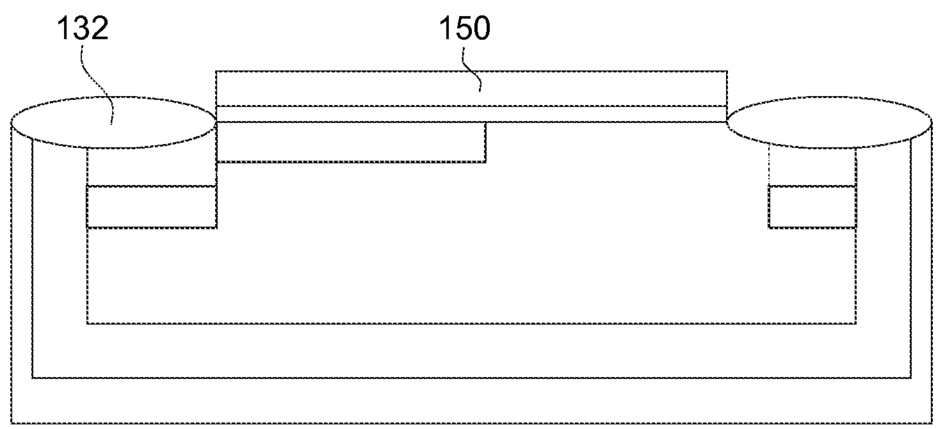
Figure 11B:
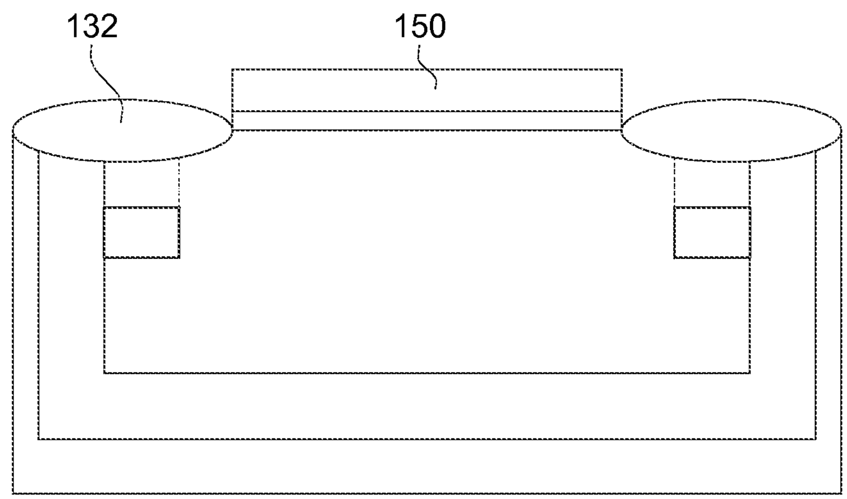

Referring to FIG. 11A and FIG. 11B, the photoresist layer 156 is removed. The isolation structure 132 may be formed in a portion of the structure not covered by the mask layer 150 by using a field oxidation (FOX) process. However, the present disclosure is not limited thereto. In embodiments, the isolation structure 132 may use a STI structure.

Figure 12A:
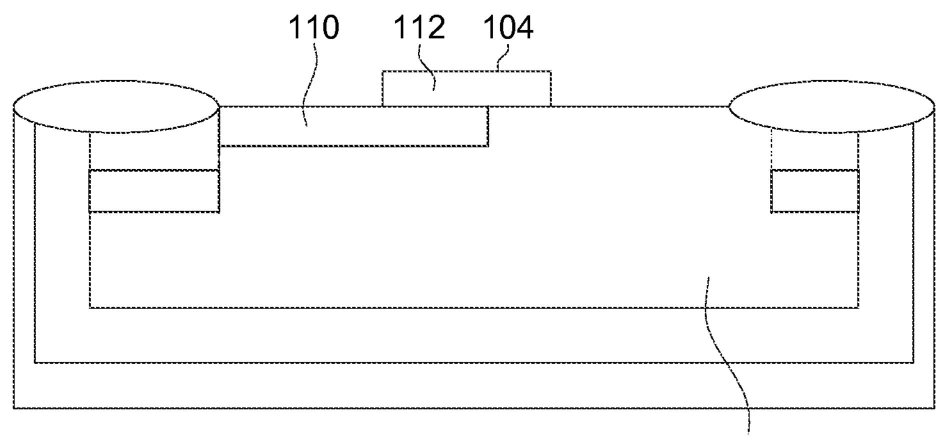
Figure 12B:
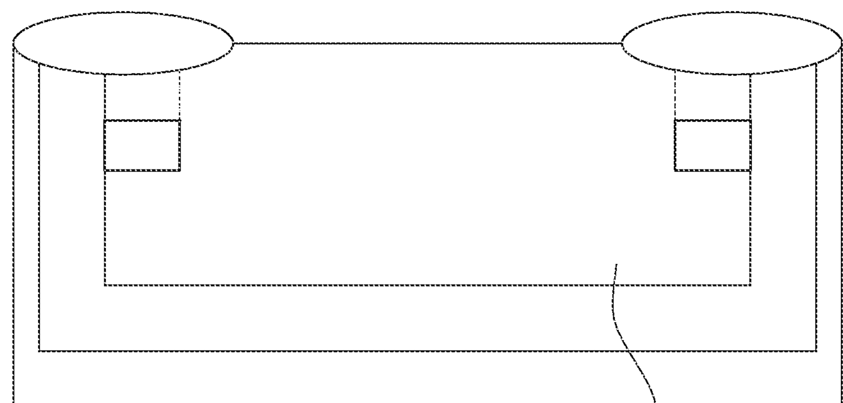

Referring to FIG. 12A and FIG. 12B, the mask layer 150 is removed. The gate structure 104 is formed on the doped substrate 102 and the field doped region 110. The gate structure 104 comprises the gate dielectric layer formed on the doped substrate 102 and the field doped region 110, and the gate electrode layer 112 on the gate dielectric layer. The gate dielectric layer may comprise an oxide or a nitride, such as silicon oxide, silicon nitride or silicon oxynitride, or other suitable dielectric materials. The gate electrode layer 112 may comprise single crystal silicon, polysilicon, a metal, a metal silicide, or other suitable conductive materials. Formation methods may comprise a deposition method, such as a CVD method, a PVD method, or other suitable methods.

Figure 13A:
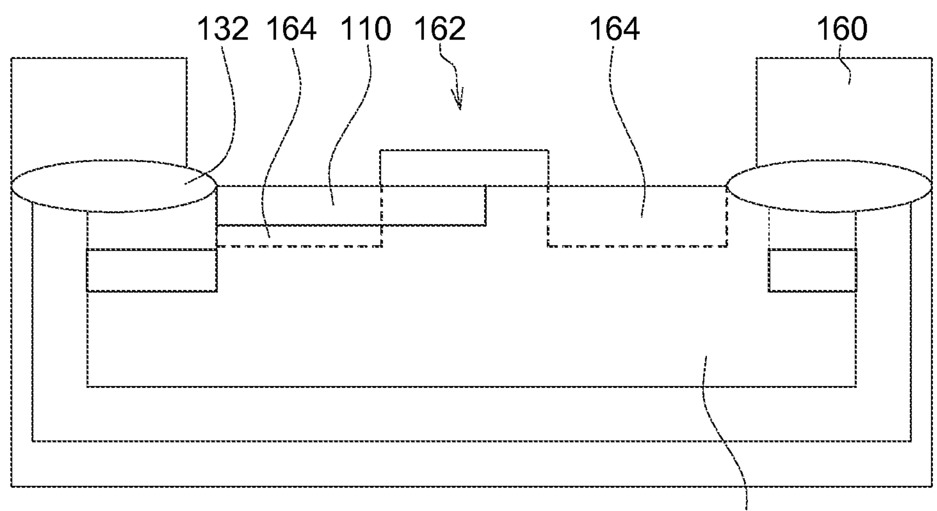
Figure 13B:
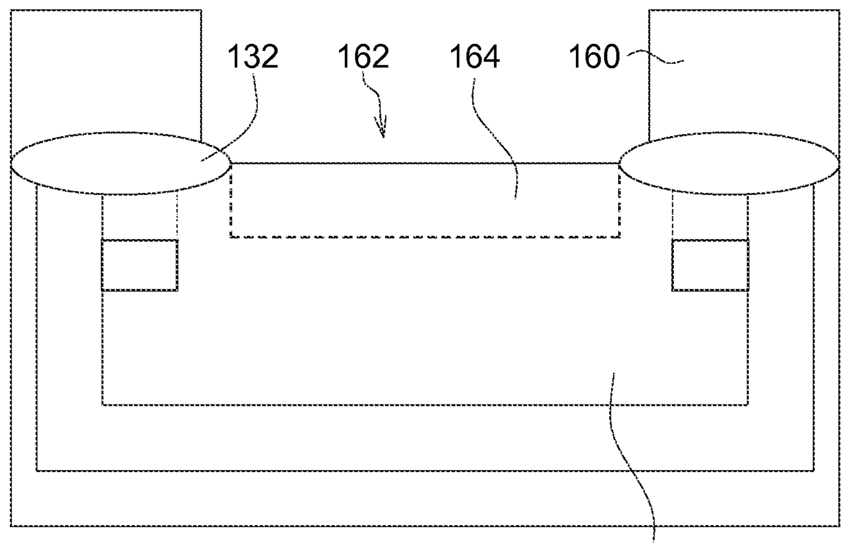

Referring to FIG. 13A and FIG. 13B, a patterned photoresist layer 160 is formed. A first doped portion 164 of the N type conductivity is formed by doping an N type dopant into the doped substrate 102 and the field doped region 110 exposed by an opening 162 of the photoresist layer 160. The gate structure 104 may be functioned a mask for this doping process. In some embodiments, the first doped portion 164 may be formed by using a tilt angle implantation step, and thus have a doped profile embedded in the doped substrate 102 under the isolation structure 132.

Figure 14A:
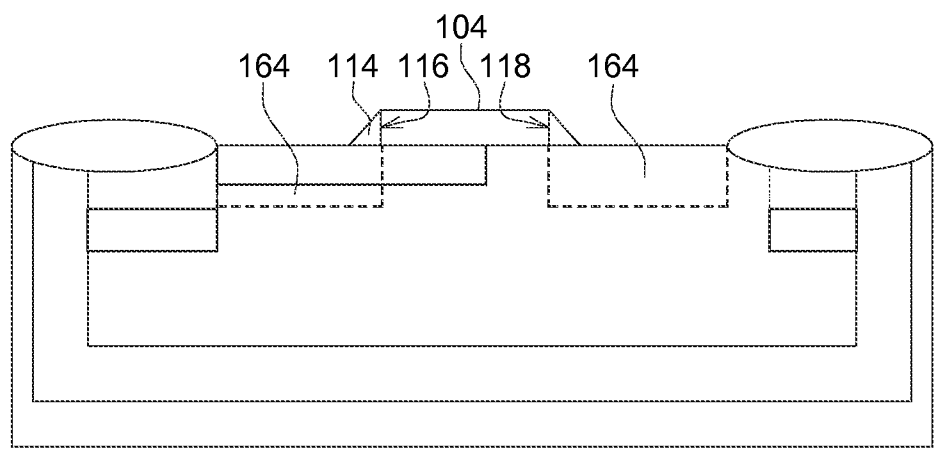
Figure 14B:
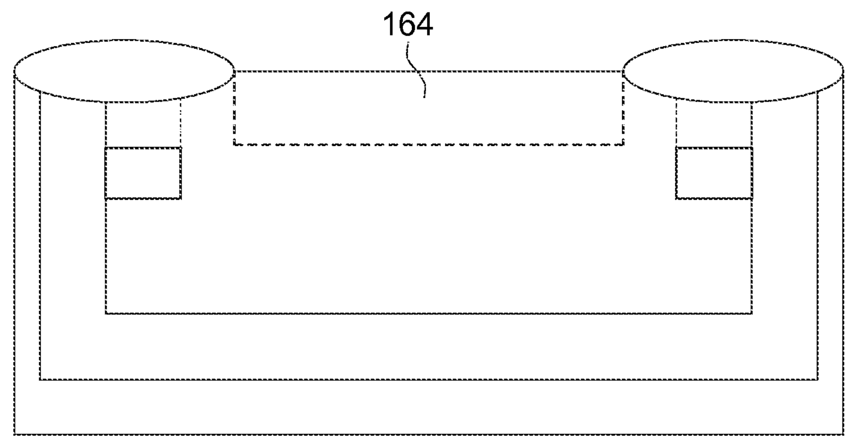

Referring to FIG. 14A and FIG. 14B, the photoresist layer 160 is removed. The spacer 114 is formed on the first gate sidewall 116 and the second gate sidewall 118 of the gate structure 104. The spacer 114 may comprise an oxide or a nitride, such as silicon oxide, silicon nitride, or silicon oxynitride, or other suitable dielectric materials. Formation methods may comprise a deposition method, such as a CVD method, a PVD method, or other suitable methods.

Figure 15A:
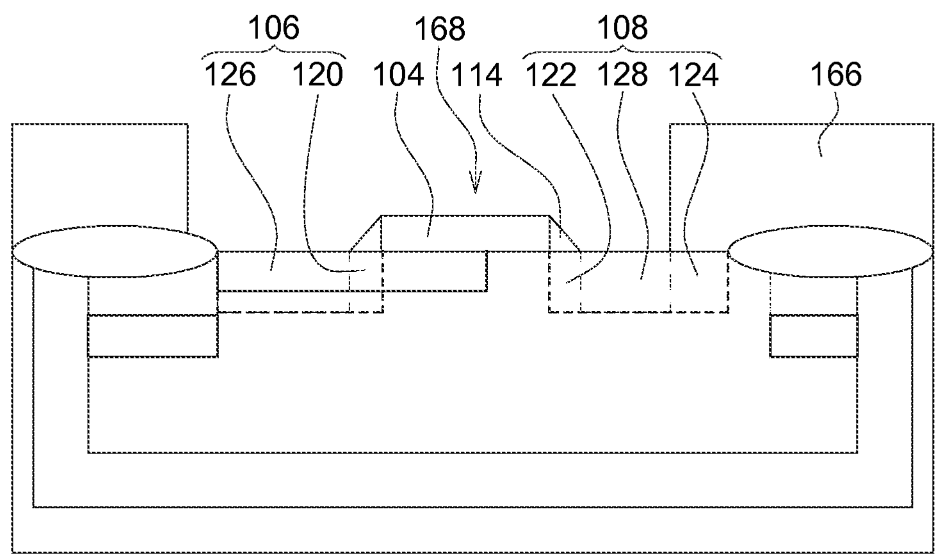
Figure 15B:
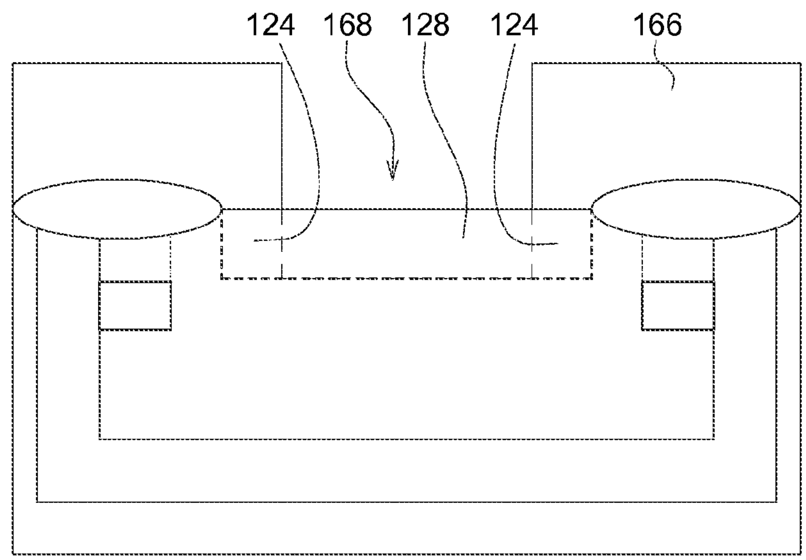

Referring to FIG. 15A and FIG. 15B, a patterned photoresist layer 166 is formed. The second doped portions 126, 128 having a N type dopant concentration higher than a N type dopant concentration of the first doped portion 164 are formed by doping a N type dopant into the first doped portion 164 (FIG. 14A and FIG. 14B) exposed by an opening 168 of the photoresist layer 166. The gate structure 104 and the spacer 114 are functioned as a mask for this implantation process. Portions of the first doped portion 164 not overlapped with the second doped portions 126, 128 form the first doped portions 120, 122, 124. In some embodiments, lower surfaces of the second doped portions 126, 128 may be substantially at the same level or deeper than lower surfaces of the first doped portions 120, 122, 124. In some embodiments, the second doped portions 126, 128 may be formed by an implantation process with a doping direction normal to a substrate surface.

Then, the photoresist layer 166 may be removed to form the semiconductor structure as shown in FIG. 1A and FIG. 1B.

Figure 16A:
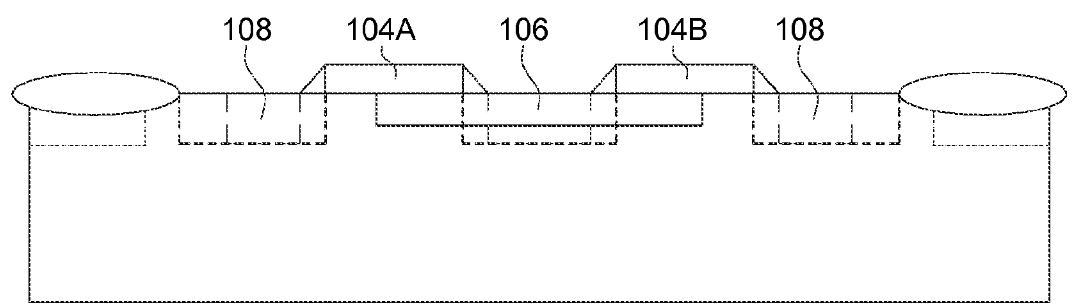
FIG. 16A is a cross-section view of a semiconductor structure according to one embodiment.
Figure 16B:
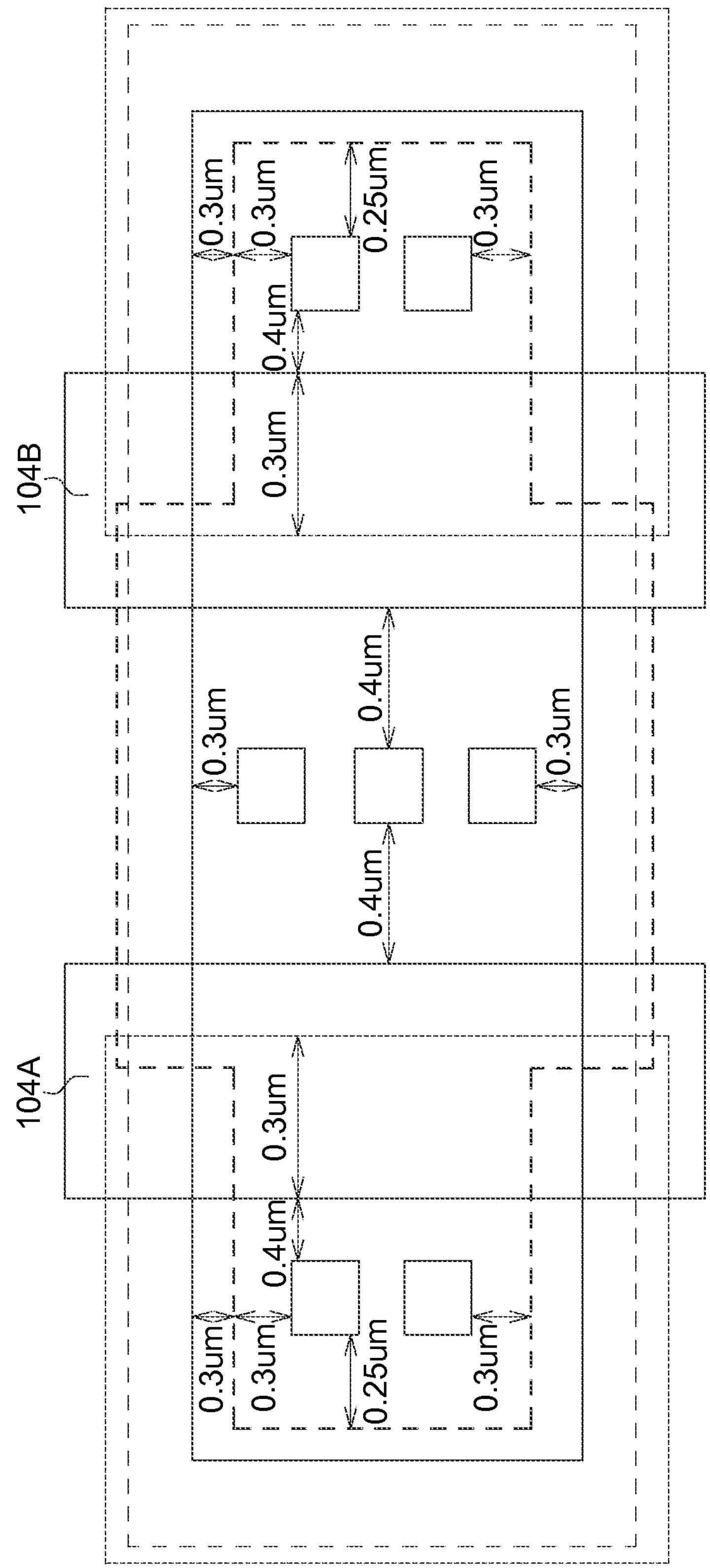
FIG. 16B shows a layout design for a semiconductor structure according to one embodiment.

The semiconductor structure in an another embodiment shown in a cross-section view of FIG. 16A and a layout design of FIG. 16B, respectively, is different from the semiconductor structure shown in FIG. 1A and FIG. 2 in that the semiconductor structure has two gate structure 104A and 104B, with the common source 106 therebetween.

Figure 17A:
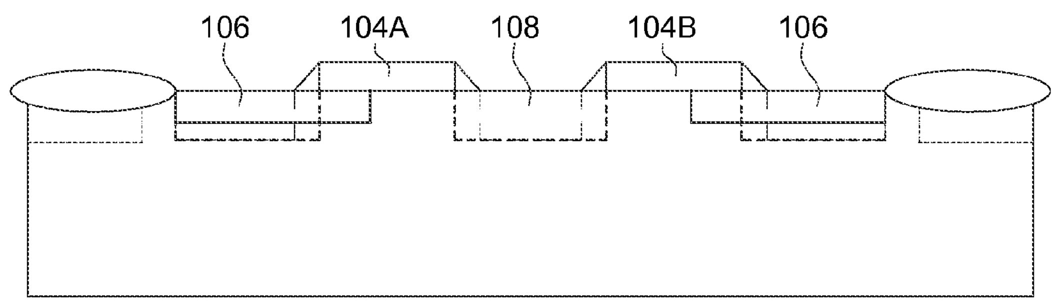
FIG. 17A is a cross-section view of a semiconductor structure according to one embodiment.
Figure 17B:
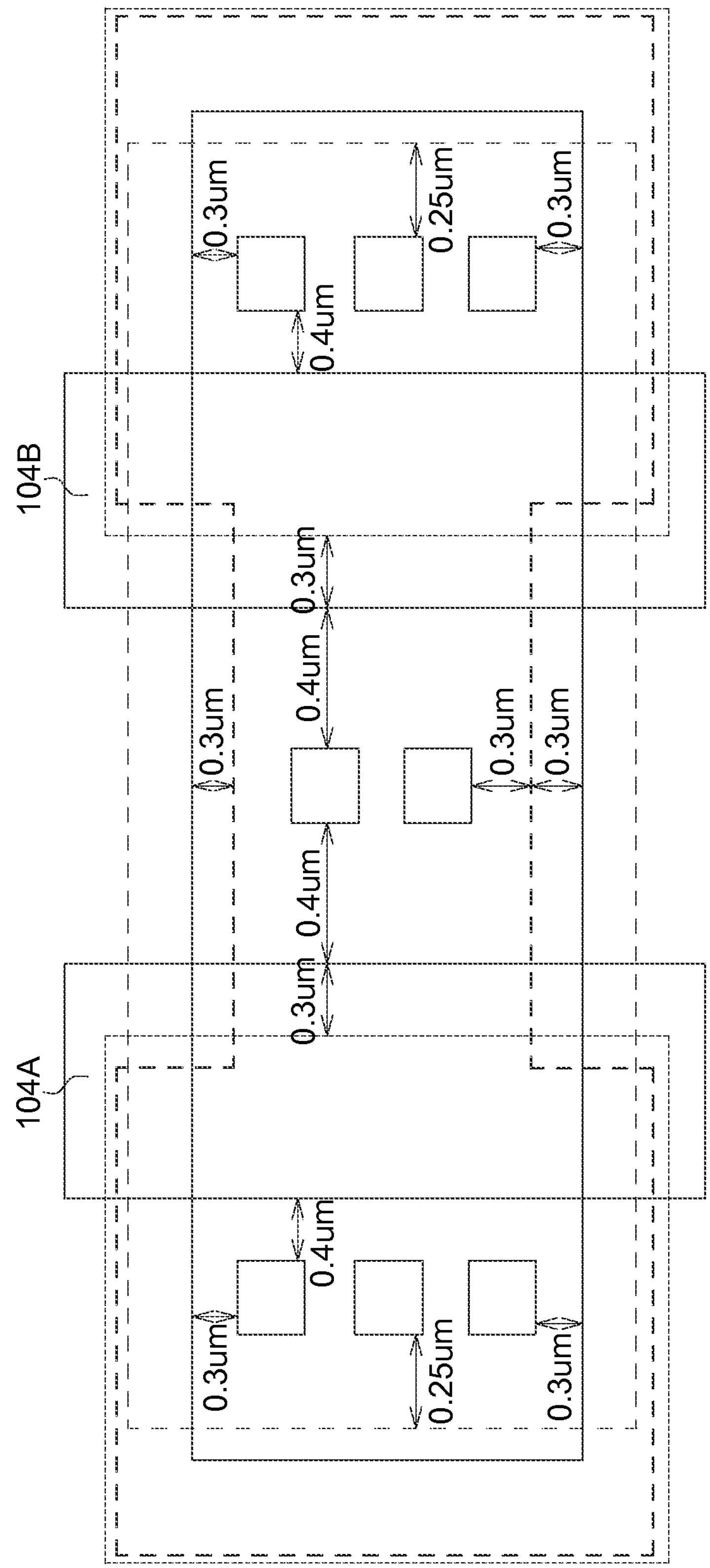
FIG. 17B shows a layout design for a semiconductor structure according to one embodiment.

The semiconductor structure in an yet another embodiment shown in a cross-section view of FIG. 17A and a layout design of FIG. 17B, respectively, is different from the semiconductor structure shown in FIG. 1A and FIG. 2 in that the semiconductor structure has two gate structure 104A and 1046, with the common drain 108 therebetween.

The concepts of the present disclosure are illustrated with a NMOS structure. In other embodiments, the conductivity type for the elements may be changed into opposing types to form a PMOS structure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:

a doped substrate;

a gate structure;

a source and a drain in the doped substrate on opposing sides of the gate structure respectively; and a field doped region having a conductivity type opposite to a conductivity type of the source and the drain, extending from the source to be beyond a first gate sidewall of the gate structure but not reaching a second gate sidewall of the gate structure opposing to the first gate sidewall;

wherein each of the source and the drain comprises a first doped portion and a second doped portion adjacent to the first doped portion and having a dopant concentration higher than a dopant concentration of the first doped portion having the same type conductivity with the second doped portion, the first doped portion of the drain is extended beyond opposing sidewalls of the second doped portion of the drain.

2. The semiconductor structure according to claim 1, wherein the first doped portion of the source is extended beyond only one of opposing sidewalls of the second doped portion of the source.

3. The semiconductor structure according to claim 1, further comprising an isolation structure, wherein each of the source and the drain comprises a first doped portion and a second doped portion adjacent to the first doped portion and having the same type conductivity with the first doped portion, a dopant concentration of the first doped portion is smaller than a dopant concentration of the second doped portion, the first doped portion of the drain is in the doped substrate between the isolation structure and the second doped portion.

4. The semiconductor structure according to claim 3, wherein a length of the first doped portion of the drain between the isolation structure and the second doped portion of the drain is 0.1 μm~1 μm.

5. The semiconductor structure according to claim 4, wherein the first doped portion of the source is extended beyond only one of opposing sidewalls of the second doped portion of the source.

6. The semiconductor structure according to claim 1, further comprising a doped field, wherein the source or the drain is in the doped substrate between the doped field and the gate structure, a first doped portion of the drain and the doped field are separated from each other by the doped substrate.

7. The semiconductor structure according to claim 6, wherein the doped substrate separating the first doped portion of the drain and the doped field has a length of 0.1 μm~1 μm.

8. The semiconductor structure according to claim 1, further comprising a doped field, wherein the source and the drain are in the doped substrate between the doped field and the gate structure, a gap distance between a first doped portion of the drain and the doped field is bigger than a gap distance between a first doped portion of the source and the doped field.

9. The semiconductor structure according to claim 1, further comprising a doped field away from the gate structure farther than the source or the drain, and an isolation structure on the doped field.

10. The semiconductor structure according to claim 1, wherein the doped substrate and the field doped region both have a first type conductivity, the source and the drain both have a second type conductivity opposite to the first type conductivity.

11. The semiconductor structure according to claim 1, further comprising a spacer adjoined to the first gate sidewall or/and the second gate sidewall of the gate structure.

12. The semiconductor structure according to claim 1, wherein the source and the drain have a non-symmetrical structure with the gate structure as an axis.

13. The semiconductor structure according to claim 1, wherein the field doped region is only in the doped substrate adjacent to the first gate sidewall of the gate structure.

14. The semiconductor structure according to claim 1, wherein each of the source and the drain comprises a first doped portion, the field doped region is between the first doped portion of the source and the first doped portion of the drain.

15. A semiconductor structure, comprising:

a doped substrate;

a gate structure;

a source and a drain in the doped substrate on opposing sides of the gate structure respectively; and a field doped region having a conductivity type opposite to a conductivity type of the source and the drain, wherein the field doped region is adjoined under the gate structure and has a field sidewall between opposing first and second gate sidewalls of the gate structure;

wherein each of the source and the drain comprises a first doped portion and a second doped portion adjacent to the first doped portion and having a dopant concentration higher than a dopant concentration of the first doped portion having the same type conductivity with the second doped portion, the first doped portion of the drain is extended beyond opposing sidewalls of the second doped portion of the drain.

16. The semiconductor structure according to claim 15, wherein the field doped region and the doped substrate have the same type conductivity.

17. The semiconductor structure according to claim 15, wherein a dopant concentration of the field doped region is bigger than a dopant concentration of the doped substrate.

18. A semiconductor structure, comprising:

a doped substrate;

a gate structure having a gate length;

a source and a drain in the doped substrate on opposing sides of a first gate sidewall and a second gate sidewall of the gate structure respectively; and a field doped region separated from the drain by the doped substrate and having a field sidewall facing toward the drain, wherein the second gate sidewall and the field sidewall have a gap length therebetween, a ratio of the gap length to the gate length is 0.1~0.5.

19. The semiconductor structure according to claim 18, wherein the gap length is 0.1 μm~1 μm.

* * * * *